(12) United States Patent
Akerman (10) Patent No.: US 10,615,748 B2
(45) Date of Patent: Apr. 7, 2020

(54) SPIN OSCILLATOR DEVICE

(71) Applicant: Johan Akerman, Sollentuna (SE)

(72) Inventor: Johan Akerman, Sollentuna (SE)

(73) Assignee: Johan Åkerman, Sollentuna (SE)

( * ) Notice: Subject to any disclaimer, the term of this patent is extended or adjusted under 35 U.S.C. 154(b) by 203 days.

(21) Appl. No.: 15/303,063

(22) PCT Filed: Apr. 2, 2015

(86) PCT No.: PCT/SE2015/050410
§ 371 (c)(1),
(2) Date: Oct. 10, 2016

(87) PCT Pub. No.: WO2015/156727
PCT Pub. Date: Oct. 15, 2015

(65) Prior Publication Data
US 2017/0033742 A1  Feb. 2, 2017

(30) Foreign Application Priority Data

Apr. 9, 2014 (SE) ...................................... 1450442

(51) Int. Cl.
| H03B 15/00 | (2006.01) |
| H01F 10/32 | (2006.01) |
| G11C 11/16 | (2006.01) |
| G11B 5/39  | (2006.01) |
| H03L 7/26  | (2006.01) |

(Continued)

(52) U.S. Cl.
CPC ......... *H03B 15/006* (2013.01); *G11B 5/3909* (2013.01); *G11C 11/16* (2013.01);
(Continued)

(58) Field of Classification Search
CPC ......... H01L 43/06; H01L 43/02; H01L 43/04; H01L 43/08; G11B 5/3909; H03L 7/26;
(Continued)

(56) References Cited

U.S. PATENT DOCUMENTS 9,543,894 B2 *  1/2017  Akerman ............ H01F 10/3286
2009/0180311 A1  7/2009  Ono et al.

FOREIGN PATENT DOCUMENTS

WO  WO 2009/141667 A1  11/2009

OTHER PUBLICATIONS

Propagating two-dimensional magnetic droplets M.A. Hoefer et al, Physica D, 241(2012) 890-901.*

(Continued)

*Primary Examiner* — Arnold M Kinkead
(74) *Attorney, Agent, or Firm* — Renner, Otto, Boisselle & Sklar, LLP (57) ABSTRACT

The present invention relates to using spin transfer torque underneath a nanocontact on a magnetic thin film with perpendicular magnetic anisotropy (PMA), provides generation of dissipative magnetic droplet solitons and magnetic droplet-skyrmions and report on their rich dynamical properties. Micromagnetic simulations identify the conditions necessary to nucleate and drive droplet-skyrmions over a wide range of currents and fields. Micromagnetic simulations also demonstrate how droplets and droplet-skyrmions can be used as skyrmion injectors and detectors in skyrmion-based magnetic memories. The droplet-skyrmion can be controlled using both current and magnetic fields, and is expected to have applications in spintronics, magnonics, skyrmionics, and PMA-based domain-wall devices.

20 Claims, 11 Drawing Sheets

(51) Int. Cl.
*H01F 41/32* (2006.01)
*H01L 43/02* (2006.01)
*H01L 43/04* (2006.01)
*H01L 43/06* (2006.01)
*H01L 43/08* (2006.01)

(52) U.S. Cl.
CPC ........ *G11C 11/161* (2013.01); *G11C 11/1675* (2013.01); *H01F 10/3286* (2013.01); *H03L 7/26* (2013.01); *H01F 41/325* (2013.01); *H01L 43/02* (2013.01); *H01L 43/04* (2013.01); *H01L 43/06* (2013.01); *H01L 43/08* (2013.01)

(58) Field of Classification Search
CPC .............. H01F 10/3286; H03B 15/006; G11C 11/1675; G11C 11/161; G11C 11/16
USPC ....... 331/94.1, 3, 107 G, 107 T; 365/8, 9, 55
See application file for complete search history.

(56) References Cited

OTHER PUBLICATIONS

International Search Report and Written Opinion for corresponding Patent Application No. PCT/SE2015/050410 dated Jul. 7, 2015.
S.M. Mohseni et al.: "Spin Torque-Generated Magnetic Droplet Solitons," Mar. 15, 2013, vol. 339, No. 6125, pp. 1295-1298, figures 1A-D.
Seyed Majid et al.: "KTH Information and Communication Technology Spin Valves and Spin-Torque Oscillators with Perpendicular Magnetic Anisotrphy," doctoral thesis, internet, Dec. 1, 2012, p. 1, figures 6.5, 6.7, 6.12, URL: http://diva-portal.org/smash/get/diva2:570422/FULLTEXT01.pdf.
Y Zhou et al.: "Dynamical Magnetic Skyrimons," internet, Apr. 12, 2014, the whole document, URL: https://arxiv.org/pdf/1404.3281.pdf.

* cited by examiner

SPIN OSCILLATOR DEVICE

This application is a national phase of International Application No. PCT/SE2015/050410 filed Apr. 2, 2015 and published in the English language, which claims priority to Swedish Patent Application No. 1450442-7 filed Apr. 9, 2014, which are hereby incorporated herein by reference in their entirety.

FIELD OF THE INVENTION

The present invention relates to a spin oscillator device comprising a spin oscillator, and use of such a device.

BACKGROUND OF THE INVENTION

Spin oscillator devices, such as spin-torque oscillators (STO:s) that utilise spin angular momentum are known.

Dissipative magnetic droplet solitons (droplets) are localized spin wave excitations realized by a balance between magnetic anisotropy, exchange, spin transfer torque, and damping. Droplets can be experimentally realized in spin oscillator devices Droplets can exhibit exotic dynamics, such as time-periodic breathing and perimeter perturbations making realization and practical use impossible.

To be used effectively in spin oscillators, droplets typically also require both a perpendicular spin transfer torque component for nucleation and control, as well as an in-plane spin polarization component for effective microwave voltage generation.

Due to the symmetry of their spin texture, droplets are not effectively injection locked by microwave currents.

Magnetic skyrmions (skyrmions) are particle-like topological solitons originally discovered in bulk ferromagnets lacking inversion symmetry. The skyrmion's spin texture results from a balance between the ordinary ferromagnetic exchange coupling, the Dzyaloshinskii-Moriya interaction (DMI), and the Zeeman energy from the applied field. Skyrmions have been proposed as the next generation magnetic information carriers in ultrathin magnetic nanowires where asymmetric interfaces provide the necessary DMI.

Thus, there is still need to solve this, which has not been possible until now.

SUMMARY OF THE INVENTION

An object of the present invention is to provide a spin oscillator device having a controllable dissipative magnetic droplet skyrmion.

Another object of the present invention is to provide a skyrmionic memory where dissipative magnetic droplet solitons and dissipative magnetic droplet skyrmions are nucleated using a spin oscillator device and in turn used to inject ordinary skyrmions into a magnetic thin film.

Another object of the present invention is to provide a skyrmionic memory where a magnetic droplet soliton is used in a spin oscillator device to detect a nearby ordinary skyrmion.

According to an embodiment of the present invention, there is provided a spin oscillator device comprising a spin oscillator having a magnetic film with perpendicular magnetic anisotropy. The spin oscillator device comprises means, or is per se, configured to generate magnetic droplet solitons and magnetic droplet skyrmions, wherein the means is configured to control the droplets solitons and skyrmions by means of applying current and/or magnetic fields.

An advantage with the present invention compared to what has until now been disclosed is that a strong enough, stable enough, and useful signal could be provided by means of the inventive device. Another advantage is high useful output power and that intrinsic dynamics such as auto-modulation can be suppressed making realization and practical use possible.

An additional advantage of the present invention is the controlled nucleation and injection of skyrmions into a skyrmionic memory as well as the controlled detection of skyrmions in a skyrmionic memory.

BRIEF DESCRIPTION OF THE DRAWING

The features and advantages of the present invention will become further apparent from the following detailed description and the accompanying drawing, of which:

FIG. 1'A shows a spin oscillator device according to an embodiment of the invention in a view from the side, FIG. 1"A shows a spin oscillator device according to an alternative embodiment of the invention in a view from the side, FIG. 1'B shows a spin oscillator device according to another embodiment of the invention in a view from the side, FIG. 1'C shows an alternative embodiment; and FIG. 1'D-F show alternative embodiments.

FIGS. 1A-D show nucleation and field-toggling of a droplet skyrmion;

DETAILED DESCRIPTION OF THE INVENTION

Embodiments of the present invention will be described as follows, starting with a detailed explanation of droplet solitons, skyrmions, and droplet-skyrmions and some basic principles related thereto. Specific references to a list of references are indicated within brackets.

Figure 1:
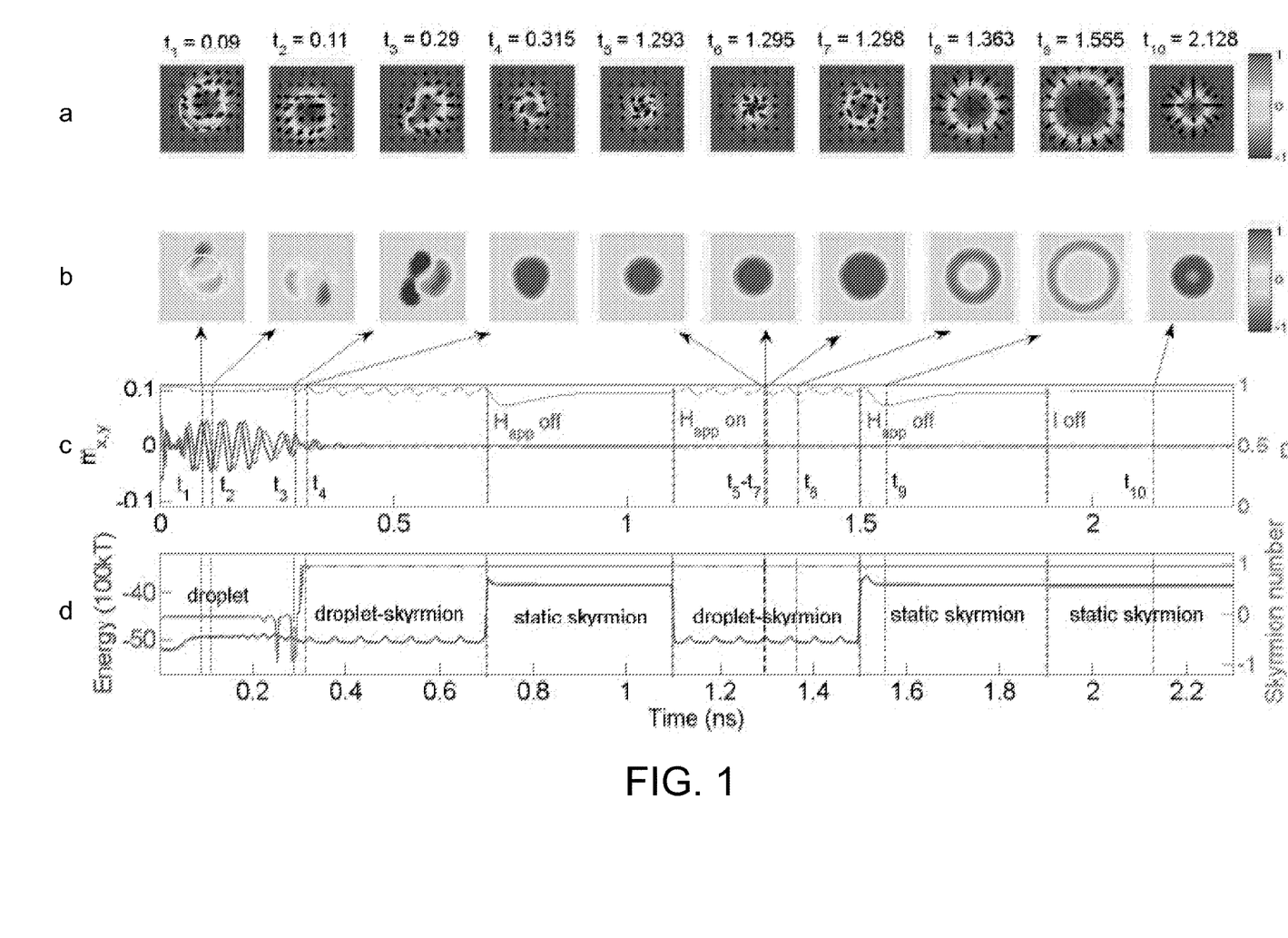

FIG. 1'A shows a spin oscillator device according to an embodiment of the invention.

The spin oscillator device 1 comprises a spin oscillator 2 having a magnetic layer 3 with perpendicular magnetic anisotropy. The spin oscillator device 1, and/or means 4, is configured to generate magnetic droplet solitons 5 and/or magnetic droplet-skyrmions. The spin oscillator 2 is configured to control the droplets solitons 5 and droplet-skyrmions by means of injecting current $I_{dc}$, and/or applying magnetic fields. In this embodiment, the spin oscillator 2 is a spin torque oscillator, STO, wherein a nano-contact, NC, 6 is provided on the magnetic film 3 providing a so-called "NC-STO" 2, 6. The means 4 can be configured to apply spin transfer torque, STT, underneath the NC 6.

The spin oscillator 2 has an active magnetic layer 3 with magnetic properties such as to be susceptible to the generation of magnetic droplet solitons 5 and/or magnetic droplet-skyrmions. One such property for magnetic droplet soliton and droplet-skyrmion generation is a perpendicular magnetic anisotropy that is large enough to orient the magnetization of the active magnetic layer 3 in an equilibrium direction M perpendicular to a plane of layer 3. Alternatively the active magnetic layer 3 may have a tilted anisotropy, or a combination of anisotropies, so as to provide a sufficient out-of-plane equilibrium orientation of the active magnetic layer 3. The generation of a magnetic droplet soliton 5 and or droplet-skyrmion also requires means to overcome spin wave damping in the active area of the active magnetic layer 3. Such means include STT or spin pumping using the spin Hall effect.

Typically, in operation, spin polarized current $I_{dc}$ is injected through the NC 6 and excites oscillations of magnetization of a free layer 9, herein a cap layer, directly under the NC 6. These oscillations generate spin waves in the free layer 8 that propagate away from the NC 6. In this device, current flows perpendicular to a stack of layers 9, 3, 7, 8, wherein a polarizing fixed layer 8 serves as a current spin polarizer.

Alternatively the spin oscillator 2 can have its active magnetic layer 3 underneath the spacer layer and its fixed polarizing layer 8 above the spacer layer, i.e. layer 3 and 8 switch places. The spin oscillator 2 generates an output signal $V_{rf}$ through a magnetoresistive effect (spacer layer 7 is metal) such as giant magnetoresistance, tunneling magnetoresistance (spacer layer 7 is a tunneling barrier), or anisotropic magnetoresistance, or a combination thereof. The spin oscillator 2 may also generate an output signal $V_{rf}$ through magnetoresistive effects in other adjacent materials where the time-varying field from the magnetic droplet soliton 5 modulates the resistance or other property of the adjacent material.

FIG. 1"A shows an alternative embodiment, wherein the active magnetic layer 3 and the polarizing fixed layer 8 are in alternative positions to the positions shown in FIG. 1"A.

FIG. 1"B shows an alternative embodiment, wherein the cap layer 9 and the magnetic layer 3 are smaller than surrounding layers.

FIG. 1"C shows an alternative embodiment.

According to an alternative embodiment of the invention, the spin oscillator 2 is based on a spin Hall Effect, instead of STT. However, this embodiment will not be further explained in this context.

According to an embodiment of the invention, the NC-STO 2, 6 is based on orthogonal pseudospin valve stacks; according to another on perpendicular pseudospin valve stacks, and according to yet another on tilted pseudospin valve stacks. The tilted pseudospin valve stacks can be made of layers having different crystalline characteristics.

Alternatively, the NC-STO 2, 6 can be based on a magnetic tunnel junction, MTJ. wherein the tilted pseudospin valve stacks are made by two or more layers tilted at different angles.

Any of the magnetic properties can have a spatial variation in any lateral direction.

A microwave current, or microwave field, or a combination of microwave current and field, at nominally the same frequency as the spin oscillator device can also be provided so as to improve the intrinsic microwave signal of the spin oscillator device.

Alternatively, a microwave current, or microwave field, or a combination of microwave current and field, at nominally any higher harmonic, or fractional harmonic, or lower sub-harmonic of the frequency of the spin oscillator device is provided so as to improve the intrinsic microwave signal of the spin oscillator device.

The provided microwave current and/or field can be originally generated by the spin oscillator device so as to provide feedback of the spin oscillator device onto itself.

A magnetic field or a current can modulate the operating point of the spin oscillator device.

The spin oscillator device can be employed for frequency shift keying. Typical areas of use of a device disclosed above can be in one or more of: spintronics, magnonics, hard disk drives (in particular suitable for a reading head), domain-wall devices or skyrmion-based memory devices.

Now is referred to FIGS. 1a-d explaining the operation of an NC-STO in more detail for a better understanding of the embodiments given above, except for the spin oscillator based on the spin Hall effect, which will not be further explained in this context.

FIGS. 1a-d Nucleation and field-toggling of a droplet skyrmion:

A micromagnetic simulation of a NC-STO at $J=2:5*10^8$ A/cm2 showing the nucleation of a droplet, its transformation into a droplet skyrmion, and the subsequent field-controlled toggling between a droplet skyrmion and a static skyrmion: FIG. 1a is top-view of the spin structure at ten different times of the simulation; the white circle indicates the nano-contact with radius of 15 nm; FIG. 1b is a top-view of the topological density at the same times as in a; FIG. 1c shows time-trace of the three magnetisation components averaged over the simulation area (mx and my are in-plane, mz out-of-plane) with dashed vertical lines corresponding to the ten snapshots above; FIG. 1d is a time-trace of the total energy and the skyrmion number. The system first forms a droplet, which remains stable for several periods until about t=0:2 ns when it becomes increasingly susceptible to anti-skyrmion perturbations (S<0). These perturbations eventually (t=0:3 ns) give way to the formation of a droplet skyrmion with S=1. When the applied field is turned off at t=0:7 ns, the droplet skyrmion rapidly dissipates into a static skyrmion. If the field is again turned on, the skyrmion can be transformed into a droplet skyrmion in a reversible manner. Finally, if both the field and the current are turned off, the static skyrmion contracts to its equilibrium size given by the material parameters.

Figure 2:
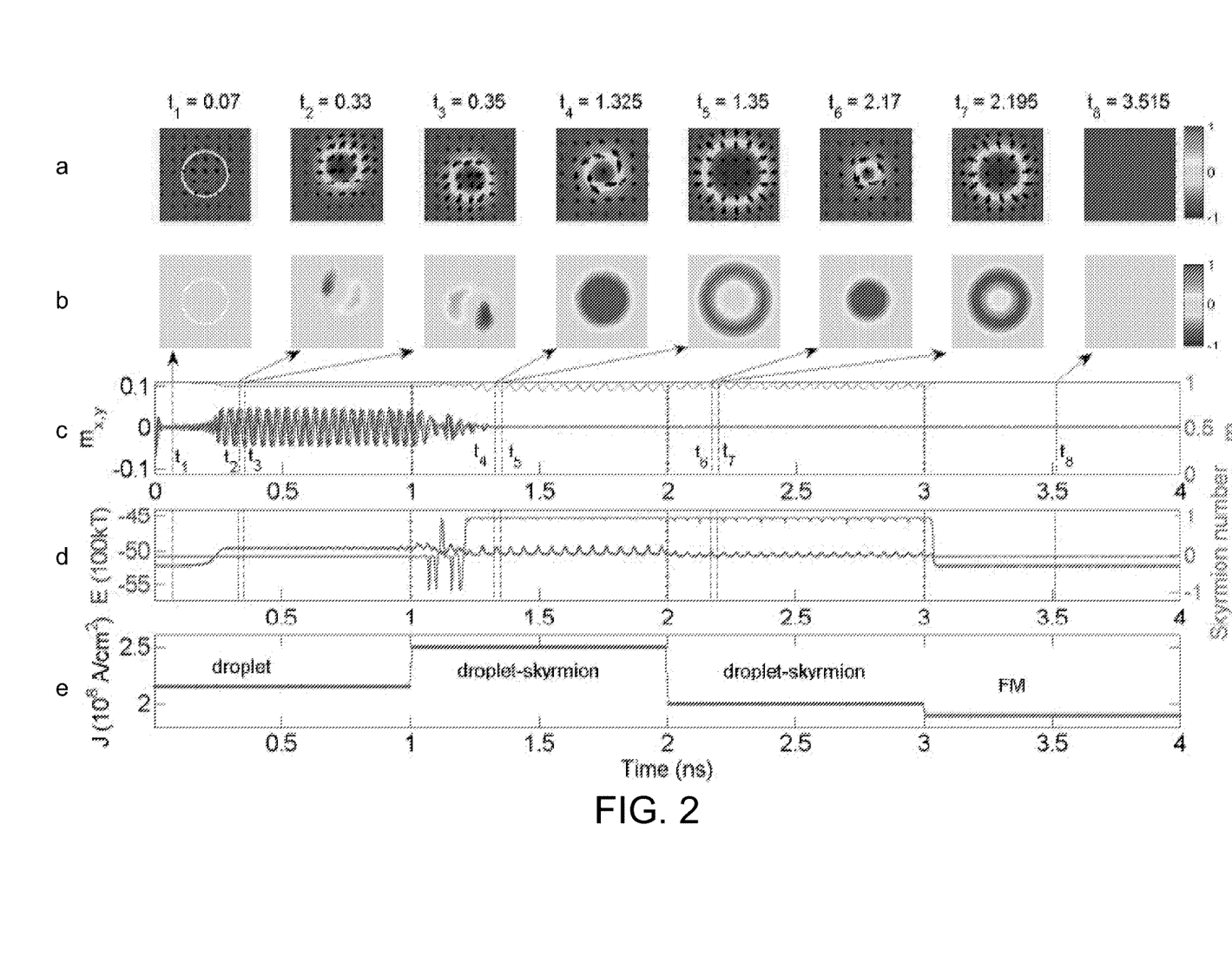
FIGS. 2A-E show nucleation and current toggling of a droplet skyrmion.

FIG. 2a-d Nucleation and current toggling of a droplet skyrmion:

A micromagnetic simulation of the same NC-STO as in FIG. 1a-d at an applied field of 0:3 kOe showing the nucleation of a droplet, a droplet skyrmion, the sustenance of the latter at low current densities, and its subsequent annihilation as the current density is further reduced. FIGS. 2a and b show the top-views of the spin structure and topological density at eight different times of the simulation. FIG. 2c shows a time trace of the three magnetisation components averaged over the simulation area with dashed vertical lines corresponding to the eight times above; FIG. 2d shows a time-trace of the total energy and the skyrmion number. The current is varied as follows: $I=2.15*10^8$ A/cm2 for 0<t<1 ns, $2.5*10^8$ A/cm$^2$ for 1 ns<t<2 ns, $2.0*10^8$ A/cm2 for 2 ns<t<3 ns, and $1.9*10^8$ A/cm2 for 3 ns<t<4 ns. Row e schematically shows the current pulses applied during the simulation.

Figure 3:
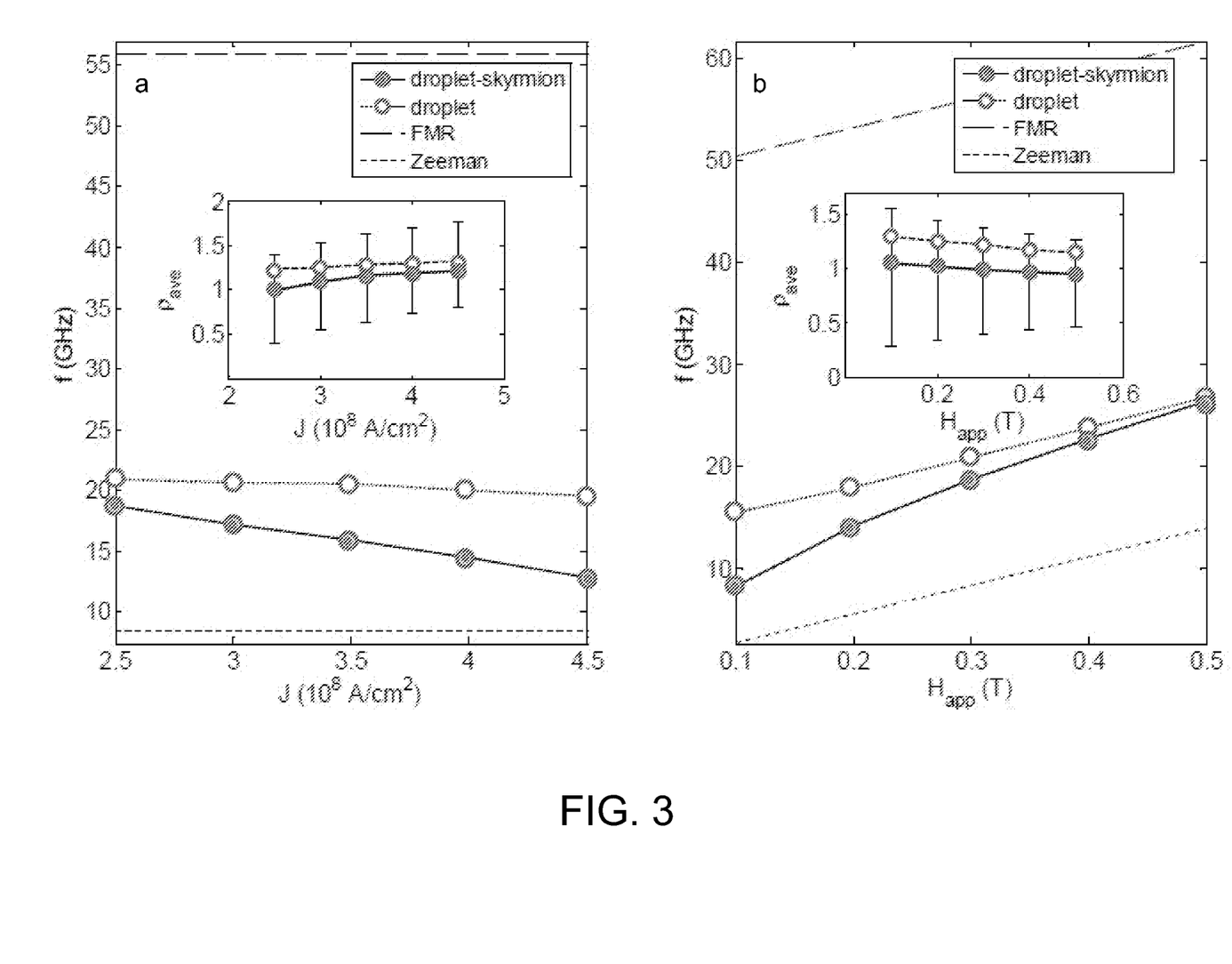
FIGS. 3A-B show tuning the droplet skyrmion.

FIGS. 3a-c Tuning the droplet skyrmion frequency:

The frequency of the droplet skyrmion is shown as solid lines and filled circles for: FIG. 3a Happ=0:3 T while the current density is varied; FIG. 3b shows $J=2:5*10^8$ A/cm2 while the applied field is varied. The corresponding droplet frequency (DMI=0) is shown as dotted lines and hollow circles. The Zeeman and FMR frequencies are shown as dashed lines. The insets show the radius of the droplet (hollow circles) and the time averaged radius of the droplet skyrmion (filled circles) where the error bars indicate the total range of radii values. The droplet skyrmion frequency decreases rapidly with increasing radius (increasing current) in FIG. 3a. As the field increases in FIG. 3b, the droplet skyrmion becomes stiffer, reducing the breathing and making the dynamics resemble that of the droplet.

Figure 4:
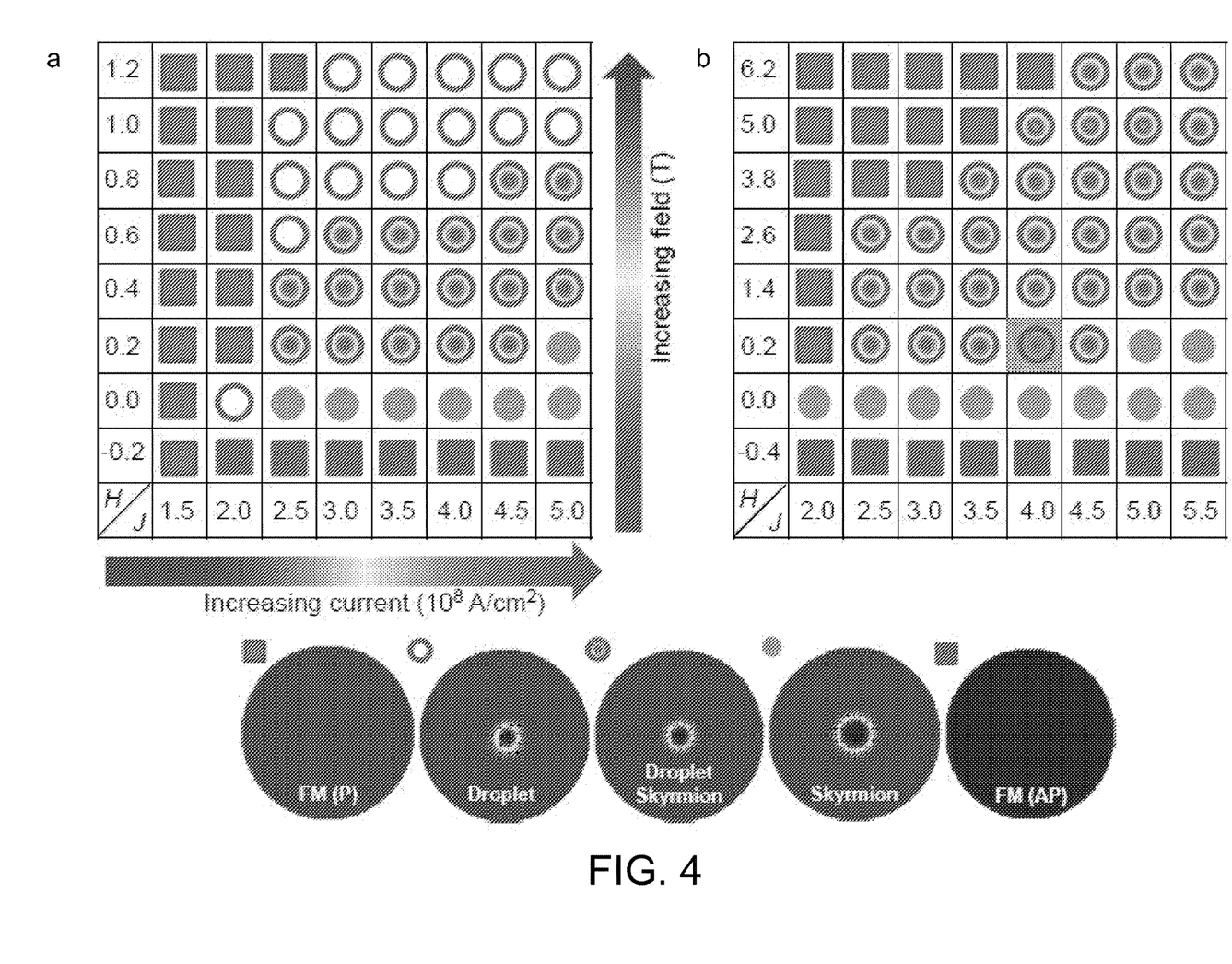
FIGS. 4A-B show nucleation and stability phase diagrams.

FIGS. 4a-b Nucleation and stability phase diagrams: FIG. 4a shows nucleation of a droplet (hollow circle), droplet skyrmion (filled rainbow circle), and static skyrmion (green filled circle) at different fields and currents. FIG. 4b shows stability of the droplet skyrmion over a very wide range of current and field. Note that the field axis is nonlinear to reach the final collapse of the droplet skyrmion at very high fields. The droplet skyrmion was nucleated using the conditions highlighted by the pink square.

Figure 5:
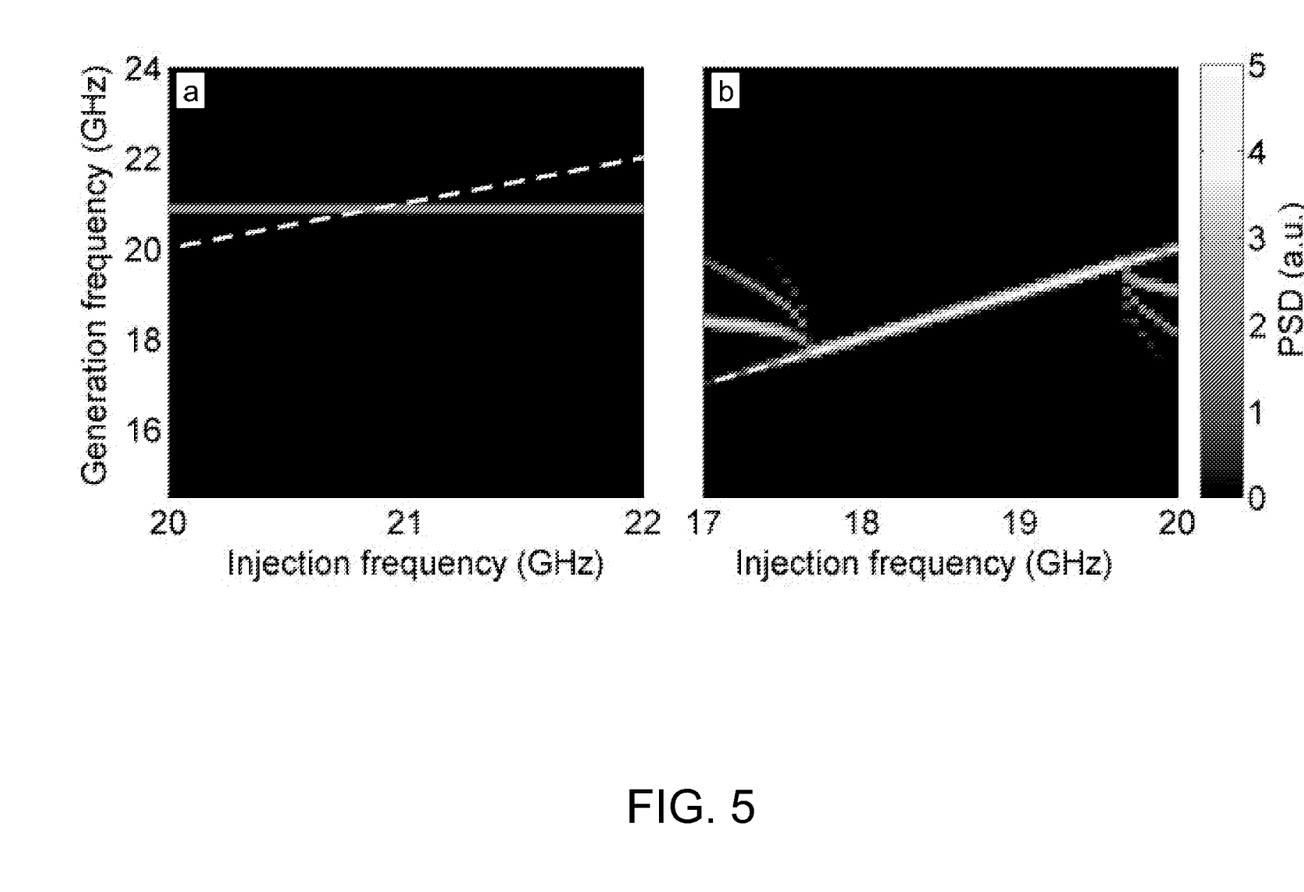
FIGS. 5A-B show droplet and droplet skyrmion injection locking.

FIGS. 5a-b Droplet and droplet skyrmion injection locking:

Injection locking diagram of a (FIG. 5a) droplet and (FIG. 5b) droplet skyrmion as a function of the frequency of the injected microwave current (white dashed lines). The injected signal is a pure tone with amplitude 0:2J. The full current-induced Oersted field is also included in these simulations. While the droplet is not visibly injection locked for the considered parameters, the droplet skyrmion exhibits a very large phase locking bandwidth of approximately 3 GHz. Outside of the locked region the droplet skyrmion exhibits strong intermodulation products further demonstrating its strong interaction with the injected current.

Figure 6:
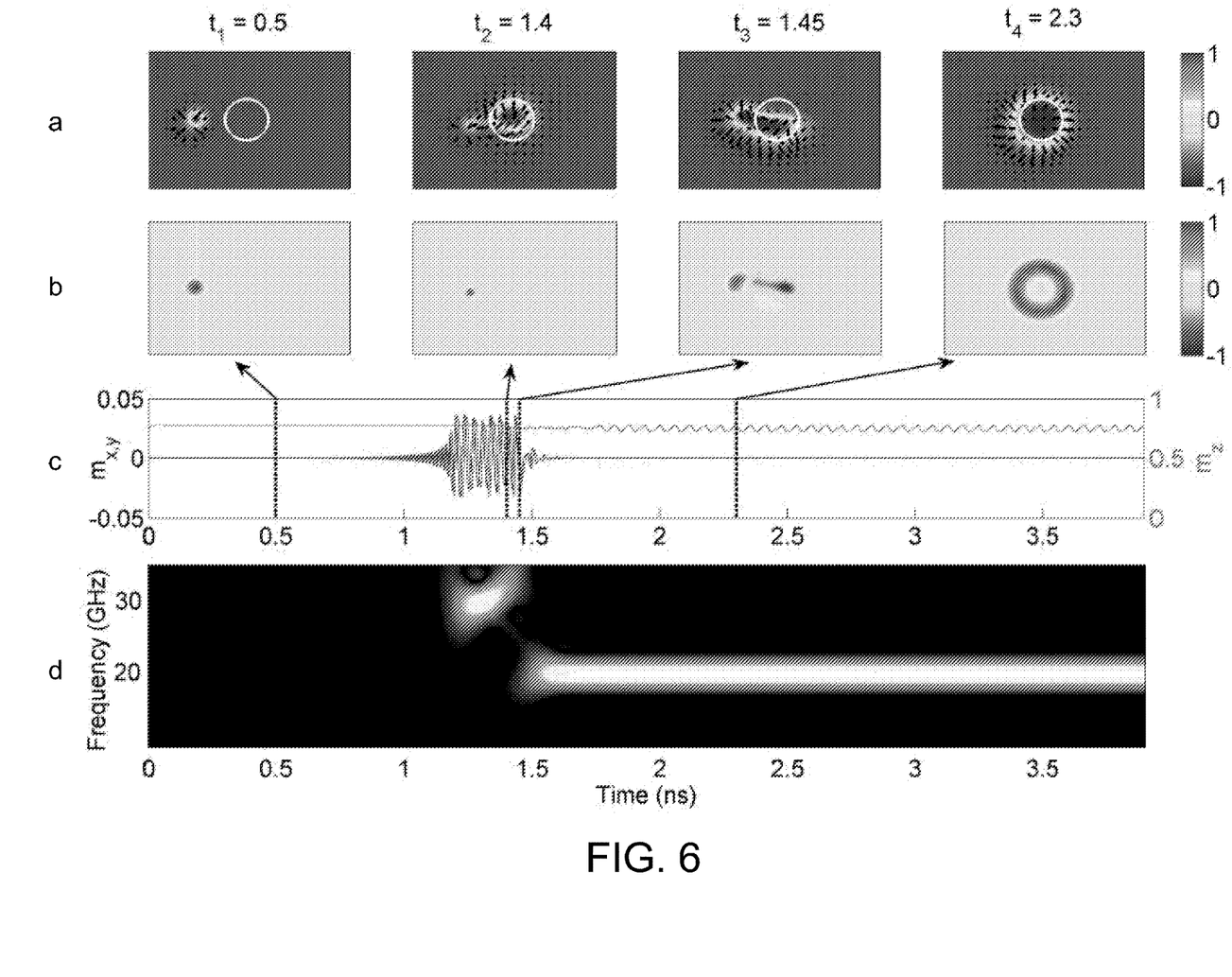
FIGS. 6a-d show droplet nucleation and skyrmion readout.

FIGS. 6a-d Droplet nucleation and skyrmion read-out:

FIGS. 6a and b are the top-views of the spin structure and normalized topological density at four different times; FIG. 6c shows time-trace of the three magnetisation components averaged over the simulation area with dashed vertical lines corresponding to the snapshots above; FIG. 6d shows time-dependent frequency of the precessing magnetization. A static skyrmion is initialized as the micromagnetic ground state at t1. By applying a current density J=2:15*10$^8$ A/cm2, a droplet is nucleated (t2). The droplet acts as an attractive source for the static skyrmion until it merges at t3. The droplet absorbs the skyrmion topology as evidenced by the reduction of the in-plane magnetisation and the frequency drop as the droplet skyrmion forms at (t4).

There has been a recent rapid increase in the interest in magnetic skyrmions [1-8], which are particle-like topological solitons originally discovered in bulk ferromagnets lacking inversion symmetry, such as the non-centrosymmetric MnSi and FeCoSi [9, 10] and later also in thin films of similar materials [10, 11]. The magnetic skyrmion's spin texture results from a balance between the ordinary ferromagnetic exchange coupling, the Dzyaloshinskii-Moriya interaction (DMI), and the Zeeman energy from the applied field. Very recently, skyrmions were also proposed as the next generation magnetic information carriers in ultra-thin magnetic nanowires where asymmetric interfaces provide the necessary DMI [12-14]. As information carriers, it is vital to nucleate isolated skyrmions in opposition to the skyrmion lattice phase observed for non-centrosymmetric thin films [11]. Such isolated skyrmions were recently demonstrated experimentally by using spin-polarized tunneling microscopy (STM) at zero field in one monolayer of Fe grown in Ir(111) [15].

In parallel with this rapid development, a novel dynamic, dissipative, and non-topological magnetic soliton, the so-called magnetic droplet [16], was very recently experimentally demonstrated [17] using spin transfer torque (STT) in nano-contact spin torque oscillators (NC-STOs) with perpendicular magnetic anisotropy (PMA) free layers. While originally considered a theoretical curiosity, only stable in magnetic PMA films with zero spin wave damping [18, 19], the advent of STT [20, 21] made it possible to locally create an effectively loss-less spin wave medium [22, 23] with the required material properties for droplet nucleation, control, and manipulation [16, 24].

While droplets and skyrmions have up to this point been studied entirely separately with little cross-fertilization between the two, they are in fact strongly related. The fundamental properties that so far separate them are their dynamical, topological, and dissipative character. The droplet is dynamic in the sense that all its spins precess at a single frequency; in a skyrmion the spin texture stays static and only its spatial extent can be varied by external factors e.g. ac electromagnetic waves and thermal gradients [25-27]. The droplet is non-topological with a skyrmion number of zero; the skyrmion is topologically protected and has a skyrmion number of 1. The droplet is dissipative and requires STT to sustain both its precession and envelope; the topological protection afforded the skyrmion makes its spin structure inherently stable against dissipative unwinding.

Despite these seemingly mutually exclusive properties, we here demonstrate how several of these characteristics can be successfully combined, yielding at the same time a dynamical, dissipative, and topologically protected magnetic droplet-skyrmion.

We micromagnetically [28] model a NC-STO with an ultra-thin PMA Co free layer, similar to the layer simulated in Ref. [12]. For an out-of-plane applied field of Ha=0:3 T and current density J=2:5*10$^8$ A/cm2, FIG. 1a-d shows the rapid nucleation of a magnetic droplet soliton exhibiting its typical characteristics of precessing spins along its perimeter. Because of the large DMI, the spin structure is substantially perturbed (t1 and t2) compared to the situation where DMI is absent. The perturbation can be expressed in terms of the local topological density [29, 30] n. The topological density is also the integrand in the definition of the skyrmion number S. For example, at times t1 and t2, regions of weak non-zero topological density are found to rotate around the droplet perimeter. While the droplet is stable for a number of periods the topological perturbations continue to grow in amplitude and almost drive the formation of an anti-skyrmion (S approaches −1 at t3) just before the system switches into a stable S=1 state at t4. This new state retains the dynamical precessing character of the droplet, while having the topology of a skyrmion, and is therefore best described as a droplet skyrmion. Just as in the droplet, the spins along the perimeter of the droplet skyrmion precess at a single frequency well below the ferromagnetic resonance yet above the Zeeman frequency $f_Z$. However, in contrast to the droplet, where the spins precess in phase (except for local perturbations), the spins in the droplet skyrmion acquire a full 2*pi phase rotation along its perimeter at all times. This leads to continuous transformations between hedgehog and vortex-like spin textures [31]. While the droplet size typically remains stable during its excitation, the droplet skyrmion experiences dramatic breathing such that its radius varies by up to a factor of 5 (see insets of FIG. 3a-b below).

The breathing frequency is identical and phase-locked to the precession frequency and, consequently, to the transforming spin texture. This behaviour is reminiscent of the breathing observed in quasi-1D magnetic droplet soliton pairs with non-zero chirality [32] and the droplet skyrmion indeed transforms into such a soliton pair if the lateral dimension of the simulation area is reduced to that of the NC (not shown). In both cases, the breathing is attributed to the balance between the governing magnetic energies, including STT and DMI. The size of the object thus shrinks due to the damping and the applied field while it later expands as the STT favours a larger reversed area. The specific spin orientation at the maximum and minimum droplet skyrmion extent can be linked to the DMI-induced canting of the physical boundaries as shown in Ref. [12] (See FIG. 1a-d at t6). It is important to stress that this kind of breathing in topological structures occurs at the same precessional frequency due to the aforementioned energy balance whereas breathing due to only dipolar fields is expected to occur at twice the precessional frequency [19]. As hinted above, the topology of the droplet skyrmion ensures that the spins in the perimeter precess at a single frequency while maintaining a 2|- phase rotation. This implies that the spatially averaged in-plane magnetisation is constant in time. However, the breathing causes a strong variation in the mz component that allows us to unambiguously determine the oscillation frequency. As shown below, this frequency is a good estimator of the excited dynamics and its field and current density dependencies as well as its injection locking properties allow one to unambiguously distinguish between a droplet and a droplet skyrmion in an experimental situation. If the applied field is turned off, the droplet skyrmion relaxes into a static hedgehog skyrmion. If the applied field is again turned on, the droplet skyrmion reforms as the precession restarts. The droplet skyrmion to skyrmion transition is hence entirely reversible, which is a natural consequence of their identical topology. Finally, if both field and current are turned off, a smaller static hedgehog skyrmion remains with its size given by the material parameters of the simulation. From the STT provided by a non-zero current density, one can controllably tune the size of the static skyrmion, where a positive current density increase its size and a negative current density decreases it.

The droplet skyrmions can also be nucleated by controlling only the drive current density. FIGS. 2a-e shows a micromagnetic simulation of the same NC-STO in a constant applied field of 0:3 T, which favours a uniform ferromagnetic state. After a period of weak ferromagnetic resonance (FMR) like precession, a DMI-perturbed droplet forms and now remains stable for as long as the current density is limited to J=2:15*10$^8$ A/cm$^2$. When the current density is instead increased to J=2:5*10$^8$ A/cm$^2$ the STT provides enough energy to induce strong topological fluctuations between negative and positive skyrmion numbers to finally switch the system into a stable droplet skyrmion state. Once the droplet skyrmion has formed, the current density can be reduced substantially while still sustaining the precession, until a minimum sustaining current density is reached below which the droplet skyrmion rapidly collapses into a uniform S=0 ferromagnetic state, in a similar fashion as ordinary droplets. As a consequence it is perfectly possible to repeatedly access the uniform, droplet, and droplet skyrmion states by only controlling the current density. By controlling both the drive current density and the applied field, transitions between all four states, including the static skyrmion, can be controlled at will, with the only limitation being the direct transformation of a skyrmion or droplet skyrmion into a droplet, which requires an intermediate step of a uniformly magnetized state.

In FIG. 3a-b the field- and current-dependent tunability of the droplet skyrmion and the corresponding droplet (the latter simulated by removing the DMI term but otherwise sharing identical conditions) are compared. The most salient feature of the droplet skyrmion is a much stronger frequency tunability than the droplet. Whereas the droplet frequency is essentially independent of current density and linearly dependent on the field, the frequency of the droplet skyrmion decreases rapidly and linearly with increasing current density and exhibits a non-linear field dependence, in particular at low fields. Additionally, it is observed that the droplet skyrmion maximum frequency is bounded by its droplet counterpart. The key to understanding the much stronger field- and current dependences lies in the strong breathing of the droplet skyrmion. While the ordinary droplet is always slightly larger than the nano-contact and does not vary in size significantly with either current or field, the radius of the droplet skyrmion can at low field have a minimum that is less than a third of the nano-contact radius and a maximum that is more than 50% greater than the nano-contact, as shown by the error bars in the insets in FIG. 3a-b. In other words, the breathing can make the droplet skyrmion radius vary by more than five times is minimum size. The very strong breathing will increase the dissipation and the periodic translation of the domain wall making up the droplet skyrmion perimeter will slow down the overall precession. When the current density is increased in FIG. 3a the maximum radius also increases, further slowing down the precession. However, when the field is increased in FIG. 3b the droplet skyrmion stiens, the amplitude of the breathing decreases, and as a consequence, both the maximum radius and the frequency of the droplet skyrmion approach those of the droplet.

As observed in FIGS. 2a-e above, the droplet skyrmion exhibits a similar degree of hysteresis as the original droplet, i.e. its sustaining current can be much lower than the current needed for nucleation. This hysteresis ensures a minimum degree of stability, which should make the droplet skyrmion sufficiently robust for applications. In FIGS. 4a-b we investigate this stability in more detail and present a nucleation phase diagram in FIG. 4a and a stability phase diagram in FIG. 4b. The nucleation phase diagram presents the final steady state of the simulated system, when both current and field are turned on at t0 and held constant until steady state. Five different end states can be identified: a droplet, a droplet skyrmion, a static skyrmion, and the two trivially saturated states. The stability phase diagram on the other hand, presents the final steady state at all field and current values after a droplet skyrmion has first been nucleated at the conditions shown in pink. Here only four different end states are possible as the droplet skyrmion never transforms back directly into a droplet. It is noteworthy that the droplet skyrmion is stable over a very large current and field range, more so than the droplet, which is consistent with its topological protection affording it additional stability.

The droplet skyrmion is a novel solitonic, dynamical, and topological magnetic structure possible to excite in NC-STOs. A natural first application for the droplet skyrmion is therefore as a NC-STO based microwave signal generator where it has the potential to outperform both the original propagating [33-36] and localized [34, 35, 37, 38] spin wave modes, as well as the recently discovered droplet [17] in a number of ways, including i) output power, ii) minimum operating current density, iii) current tunability, iv) maximum operating frequency, v) microwave current injection locking, and vi) lower phase noise.

Output power. One of the most attractive properties of the original magnetic droplet soliton [16, 18, 19] is its much higher output power compared to the ordinary FMR-like precession, with experiments demonstrating a 40× increase in output power as the droplet forms [17]. This is a consequence of the much larger precession angle, where a substantial fraction of the spins precess along the equator and hence make use (locally) of all the available magnetoresistance. While the droplet skyrmion also exhibits similarly large precession angles, its topological protection comes with a 2*pi rotation of the relative phase along its perimeter, and as a consequence, the large in-plane precession averages out to zero microwave output power at all times. However, the very large breathing of the droplet skyrmion, directly phase-locked to the precession frequency, restores the microwave signal. As the droplet skyrmion expands and contracts, the mz component of the local spins effectively precesses between −1 and 1. Since the breathing can be greater than 5 times the minimum droplet skyrmion diameter, which in turn is much smaller than the NC diameter, this mode essentially makes use of all the available perpendicular magnetoresistance of the device. As a consequence, the droplet skyrmion is expected to provide yet another order of magnitude increase in output power compared with the droplet, since in the latter, only the spins along the perimeter contribute their maximum power.

Minimum operating current density. As demonstrated experimentally in Ref. [17], the threshold current density for droplet nucleation in an orthogonal spin valve scales inversely with the applied out-of-plane eld; the droplet nucleation is aided and the droplet is stabilized by the perpendicular component of the spin polarized current density. The lowest threshold current density is consequently realized for axed layer that is saturated out-of-plane. However, since the droplet generates its microwave signal entirely from the inplane component of its precession, it requires a significant in-plane component of the fixed layer magnetization for signal generation; a fully saturated xed layer does not generate any microwave signal. Since the droplet skyrmion on the other hand derives its microwave signal entirely from the perpendicular magnetoresistance, it delivers its maximum output power exactly in the saturated fixed layer state. A droplet skyrmion NC-STO can hence simultaneously optimize for maximum output power and minimum operating current. Current tunability. A drawback of droplet based NC-STOs is their poor current tunability, which limits both their frequency range and current modulation properties. However, as shown in FIG. 3a above, the breathing of the droplet skyrmion provides for a very large current tunability, which makes the droplet skyrmion much more attractive for broadband microwave applications.

Maximum operating frequency. As shown in FIG. 4b above, the droplet skyrmion is inherently stable even at very high fields. Consequently, it can operate at a much higher frequency than the droplet, which is limited by the saturation field of its fixed layer. Microwave current injection locking. While the droplet is essentially insensitive to injection locking to a microwave current (FIG. 5a), the droplet skyrmion is readily injection locked (FIG. 5b), primarily due to strong coupling between the time-varying spin transfer torque and the breathing. This sensitivity is not only important in microwave sensor applications, it also provides direct means to mutually synchronize a large number of droplet skyrmion NC-STOs in series via their shared microwave current [39-42]. The dramatic difference in injection locking strength and the strong current dependence of the frequency are likely the most straightforward experimental tests for a first experimental demonstration of a droplet-skyrmion.

Phase noise. The droplet is known to be sensitive to drift away from the NC and perturbations of its perimeter, which both add significant phase noise and linewidth to its microwave signal. The droplet skyrmion appears significantly more robust against such perturbations and as a consequence should deliver a much cleaner microwave signal.

Skyrmionics. The droplet skyrmion also holds great potential for direct skyrmionic applications driven by the rich interactions between droplets, droplet skyrmions, and static skyrmions. To illustrate, we here provide one intriguing example of a droplet based ultra-fast read-out of a skyrmion. As our initial condition we take a static skyrmion in proximity to a nano-contact (FIG. 6a-d). We then pass enough current through the nano-contact to nucleate a droplet without driving a transition to a droplet skyrmion. As the DMI driven perturbations of the droplet rotate around the NC, they interact with the nearby skyrmion, which eventually feels enough of an attractive force to be pulled in underneath the nano-contact where it merges with the droplet and in the process transfers its topology, transforming the droplet into a droplet skyrmion. This transformation can be observed in the time-frequency representation of FIG. 6d where, within a fraction of a nanosecond, the spins change their precession frequency from 30 to 20 GHz and the characteristic breathing starts, instantly generating a microwave signal across the device.

The foregoing detailed description is intended to illustrate and provide easier understanding of the invention, and should not be construed as limitations. Alternative embodiments will become apparent to those skilled in the art without departing from the spirit and scope of the present invention.

LIST OF REFERENCES

[1] U. K. Roessler, A. N. Bogdanov, and C. Peiderer, Nature 442, 797 (2006).
[2] S. Heinze, K. von Bergmann, M. Menzel, J. Brede, A. Kubetzka, R. Wiesendanger, G. Bihlmayer, and S. Bluegel, Nature Physics 7, 713 (2011).
[3] T. Schulz, R. Ritz, A. Bauer, M. Halder, M. Wagner, C. Franz, C. Peiderer, K. Everschor, M. Garst, and A. Rosch, Nature Physics 8, 301 (2012).
[4] S. Seki, X. Z. Yu, S. Ishiwata, and Y. Tokura, Science 336, 198 (2012).
[5] M. Nagao, Y.-G. So, H. Yoshida, M. Isobe, T. Hara, K. Ishizuka, and K. Kimoto, Nature Nanotechnology 8, 325 (2013).
[6] R. Ritz, M. Halder, M. Wagner, C. Franz, A. Bauer, and C. Peiderer, Nature 497, 231 (2013).
[7] P. Milde, D. Koehler, J. Seidel, L. M. Eng, A. Bauer, A. Chacon, J. Kindervater, S. Muehlbauer, C. Peiderer, S. Buhrandt, C. Schuette, and A. Rosch, Science 340, 1076 (2013).
[8] A. Brataas and K. M. D. Hals, Nature Nanotechnology 9, 86 (2014).
[9] S. Muhlbauer, B. Binz, F. Jonietz, C. Peiderer, A. Rosch, A. Neubauer, R. Georgii, and P. Boni, Science 323, 915 (2009).
[10] X. Yu, Y. Onose, N. Kanazawa, J. Park, J. Han, Y. Matsui, N. Nagaosa, and Y. Tokura, Nature 465, 901 (2010).
[11] X. Yu, N. Kanazawa, Y. Onose, K. Kimoto, W. Zhang, S. Ishiwata, Y. Matsui, and Y. Tokura, Nature Materials 10, 106 (2011).
[12] J. Sampaio, V. Cros, S. Rohart, A. Thiaville, and A. Fert, Nature Nanotechnology 8, 839 (2013).
[13] A. Fert, V. Cros, and J. Sampaio, Nature Nanotechnology 8, 152 (2013).
[14] J. Iwasaki, M. Mochizuki, and N. Nagaosa, Nature Nanotechnol 8, 742 (2013).
[15] N. Romming, C. Hanneken, M. Menzel, J. E. Bickel, B. Wolter, K. von Bergmann, A. Kubetzka, and R. Wiesendanger, Science 341, 636 (2013).

[16] M. A. Hoefer, T. J. Silva, and M. W. Keller, Phys. Rev. B 82, 054432 (2010).
[17] S. M. Mohseni, S. R. Sani, J. Persson, T. N. A. Nguyen, S. Chung, Y. Pogoryelov, P. K. Muduli, E. Iacocca, A. Eklund, R. K. Dumas, S. Bonetti, A. Deac, M. A. Hoefer, and J. Åkerman, Science 339, 1295 (2013).
[18] B. Ivanov and A. Kosevich, Soy. Phys. JETP 45, 1050 (1977).
[19] A. Kosevich, B. Ivanov, and A. Kovalev, Physics Reports 194, 117 (1990).
[20] J. C. Slonczewski, Journal of Magnetism and Magnetic Materials 159, L1 (1996).
[21] L. Berger, Phys. Rev. B 54, 9353 (1996).
[22] W. H. Rippard, A. M. Deac, M. R. Pufall, J. M. Shaw, M. W. Keller, S. E. Russek, G. E. W. Bauer, and C. Serpico, Phys. Rev. B 81, 014426 (2010).
[23] S. M. Mohseni, S. R. Sani, J. Persson, T. N. Anh Nguyen, S. Chung, Y. Pogoryelov, and J. Åkerman, Physica Status Solidi RRL 5, 432 (2011).
[24] M. A. Hoefer, M. Sommacal, and T. J. Silva, Phys. Rev. B 85, 214433 (2012).
[25] M. Mochizuki, Phys. Rev. Lett. 108, 017601 (2012).
[26] Y. Onose, Y. Okamura, S. Seki, S. Ishiwata, and Y. Tokura, Phys. Rev. Lett. 109, 037603 (2012).
[27] M. Mochizuki, X. Yu, S. Seki, N. Kanazawa, W. Koshibae, J. Zang, M. Mostovoy, T. Y., and N. N., Nature Materials 13, 241 (2014).
[28] A. Vansteenkiste and B. V. de Wiele, Journal of Magnetism and Magnetic Materials 323, 2585 (2011).
[29] C. Mouta_s, S. Komineas, and J. A. C. Bland, Phys. Rev. B 79, 224429 (2009).
[30] H.-B. Braun, Advances in Physics 61, 1(2012).
[31] A. Thiaville, S. Rohart, E. Jue, V. Cros, and A. Fert, EPL 100, 57002 (2012).
[32] E. Iacocca, R. K. Dumas, L. Bookman, M. Mohseni, S. Chung, M. A. Hoefer, and J. Åkerman, Phys. Rev. Lett. 112, 047201 (2014).
[33] J. C. Slonczewski, J. Magn. Magn. Mater. 159, 261 (1999).
[34] S. Bonetti, V. Tiberkevich, G. Consolo, G. Finocchio, P. Muduli, F. Manco_, A. Slavin, and J. Åkerman, Physical Review Letters 105, 217204 (2010).
[35] R. K. Dumas, E. Iacocca, S. Bonetti, S. R. Sani, S. M. Mohseni, A. Eklund, J. Persson, O. Heinonen, and J. Åkerman, Physical Review Letters 110, 257202 (2013).
[36] M. Madami, S. Bonetti, G. Consolo, S. Tacchi, G. Carlotti, G. Gubbiotti, F. B. Manco, M. A. Yar, and J. Åkerman, Nature Nanotechnology 6, 635 (2011).
[37] A. Slavin and V. Tiberkevich, Phys. Rev. Lett. 95, 237201 (2005).
[38] V. E. Demidov, S. Urazhdin, and S. O. Demokritov, Nature Materials 9, 984 (2010).
[39] J. Grollier, V. Cros, and A. Fert, Phys. Rev. B 73, 060409 (2006).
[40] J. Persson, Y. Zhou, and J. Åkerman, J. Appl. Phys. 101, 09A503 (2007).
[41] Y. Zhou and J. Åkerman, Applied Physics Letters 94, 112503 (2009).
[42] E. Iacocca and J. Åkerman, Journal of Applied Physics 110, 103910 (2011).
[43] A. N. Bogdanov and U. K. Roler, Phys. Rev. Lett. 87, 037203 (2001).

The invention claimed is:

1. A spin oscillator device, comprising:
a spin oscillator having;
a magnetic film with perpendicular magnetic anisotropy,
a nano-contact, NC, on the magnetic film providing a NC-STO, and
a cap layer arranged between the nano-contact and the magnetic film, the cap layer providing Dzyaloshinskii-Moriya interaction to perturb the spin structure in the magnetic film;
wherein the spin oscillator is a spin torque oscillator, STO;
wherein the spin oscillator device is configured to apply spin transfer torque, STT, underneath the NC; and
wherein the spin oscillator device is configured to generate magnetic droplet skyrmions, and is configured to control the droplet skyrmions by application of current and/or magnetic fields.

2. The spin oscillator device according to claim 1, wherein the spin oscillator is based on a spin Hall Effect.

3. The spin oscillator device according to claim 1, wherein the spin oscillator device is configured to control the droplets skyrmions by application of current.

4. The spin oscillator device according to claim 1, wherein the spin oscillator device is configured to control the droplets skyrmions by application of magnetic fields.

5. The spin oscillator device according to claim 1, wherein the NC-STO is based on perpendicular pseudospin valve stacks.

6. The spin oscillator device according to claim 1, wherein the NC-STO is based on tilted pseudospin valve stacks.

7. The spin oscillator device according to claim 1, wherein the NC-STO is based on orthogonal pseudospin valve stacks.

8. The spin oscillator device according to claim 1, wherein the NC-STO is based on tilted pseudospin valve stacks where the tilt angle is non-uniform.

9. The spin oscillator device according to claim 1, wherein the NC-STO is based on a magnetic tunnel junction, MTJ.

10. The spin oscillator device according to claim 1, wherein the NC-STO is based on a combination of pseudospin valves and magnetic tunnel junctions, MTJ.

11. The spin oscillator device according to claim 6, wherein the tilted pseudospin valve stacks are made by layers having different crystalline characteristics.

12. The spin oscillator device according to claim 6, wherein the tilted pseudospin valve stacks are made by two or more layers tilted at different angles.

13. The spin oscillator device according to claim 1, configured so that any of the magnetic properties have a spatial variation in any lateral direction.

14. The spin oscillator device according to claim 1, configured so that a microwave current, or microwave field, or a combination of microwave current and field, at nominally the same frequency as the spin oscillator device is provided so as to improve the intrinsic microwave signal of the spin oscillator device.

15. The spin oscillator device according to claim 1, configured so that a microwave current, or microwave field, or a combination of microwave current and field, at nominally any higher harmonic, or fractional harmonic, or lower sub-harmonic of the frequency of the spin oscillator device is provided so as to improve the intrinsic microwave signal of the spin oscillator device.

16. The spin oscillator device according to claim 14, configured so that the provided microwave current and/or field is originally generated by the spin oscillator device so as to provide feedback of the spin oscillator device onto itself.

17. The spin oscillator device according to claim 1, configured so that a magnetic field or a current modulates the operating point of the spin oscillator device.

18. The spin oscillator device according to claim 17, configured so that the modulating magnetic field or current modulates the operating point across the nucleation point of the magnetic droplet soliton.

19. The spin oscillator device according to claim 1, where the spin oscillator device is employed for frequency shift keying.

20. A method of using a spin oscillator device, comprising:
  providing the spin oscillator device according to claim 1; and
  using the spin oscillator device in one or more of: spintronics, magnonics, hard disk drives (reading head) or domain-wall devices.

\* \* \* \* \*